(12) United States Patent
Dubois et al.

(10) Patent No.: US 11,011,793 B2
(45) Date of Patent: May 18, 2021

(54) PROTECTION OF AN ELECTRICAL ENERGY ACCUMULATION DEVICE

(71) Applicant: THALES, Courbevoie (FR)

(72) Inventors: Eric Ravindranath Dubois, Chatou (FR); Hocine Kherbouchi, Chatou (FR); Joël Bosson, Chatou (FR)

(73) Assignee: THALES, Courbevoie (FR)

( * ) Notice: Subject to any disclaimer, the term of this patent is extended or adjusted under 35 U.S.C. 154(b) by 315 days.

(21) Appl. No.: 16/331,102

(22) PCT Filed: Sep. 8, 2017

(86) PCT No.: PCT/EP2017/072537
§ 371 (c)(1),
(2) Date: Mar. 6, 2019

(87) PCT Pub. No.: WO2018/046635
PCT Pub. Date: Mar. 15, 2018

(65) Prior Publication Data
US 2019/0237726 A1    Aug. 1, 2019

(30) Foreign Application Priority Data

Sep. 9, 2016  (FR) ...................................... 16/01330
Nov. 4, 2016  (FR) ...................................... 1660667

(51) Int. Cl.
*H01M 50/24*    (2021.01)
*H01M 10/42*    (2006.01)
(Continued)

(52) U.S. Cl.
CPC ............ *H01M 50/24* (2021.01); *H01G 9/008* (2013.01); *H01G 9/08* (2013.01); *H01G 9/26* (2013.01);
(Continued)

(58) Field of Classification Search
CPC .... H01M 50/24; H01M 50/20; H01M 50/116; H01M 50/172; H01M 50/543;
(Continued)

(56) References Cited

U.S. PATENT DOCUMENTS 9,502,708 B2 * 11/2016 Wang ................. H01M 10/0431
9,692,087 B2 *  6/2017 Wang .................... H01M 4/661
(Continued)

FOREIGN PATENT DOCUMENTS

EP          2 219 295 A1    8/2010

*Primary Examiner* — Stewart A Fraser
(74) *Attorney, Agent, or Firm* — BakerHostetler

(57) ABSTRACT

The protection of an electrical energy accumulation device from electromagnetic attacks is provided. The electrical energy accumulation device comprises a housing made of an electrically conductive material, at least one electrical energy storage cell that is arranged in the housing and two terminals that are arranged through the housing, the terminals being electrically insulated from the housing, the terminals allowing electrical energy to be transferred between the at least one storage cell and the exterior of the device. The device further comprises, inside the housing, a specific component exhibiting an impedance having at least one resistive component that is higher than 1 ohm, which component is configured to dissipate the energy of electromagnetic interference attempting to penetrate the housing through at least one of the terminals.

17 Claims, 3 Drawing Sheets

(51) Int. Cl.
| | |
|---|---|
| *H01M 50/20* | (2021.01) |
| *H01M 50/116* | (2021.01) |
| *H01M 50/172* | (2021.01) |
| *H01G 9/08* | (2006.01) |
| *H02J 7/00* | (2006.01) |
| *H02H 7/00* | (2006.01) |
| *H01M 50/543* | (2021.01) |
| *H01M 50/572* | (2021.01) |
| *H01G 9/008* | (2006.01) |
| *H01G 9/26* | (2006.01) |
| *H01G 9/28* | (2006.01) |
| *H03H 7/06* | (2006.01) |

(52) U.S. Cl.
CPC .......... *H01G 9/28* (2013.01); *H01M 10/4257* (2013.01); *H01M 10/4264* (2013.01); *H01M 50/116* (2021.01); *H01M 50/172* (2021.01); *H01M 50/20* (2021.01); *H01M 50/543* (2021.01); *H01M 50/572* (2021.01); *H02H 7/00* (2013.01); *H02J 7/00* (2013.01); *H02J 7/007* (2013.01); *H02J 7/0029* (2013.01); *H02J 7/0045* (2013.01); *H01M 2010/4278* (2013.01); *H01M 2200/00* (2013.01); *H01M 2250/20* (2013.01); *H03H 7/06* (2013.01); *Y02T 90/40* (2013.01)

(58) Field of Classification Search
CPC .......... H01M 50/572; H01M 10/4264; H01M 2250/20; H01G 9/008; H01G 9/08; H01G 9/28; H03H 7/06
See application file for complete search history.

(56) References Cited

U.S. PATENT DOCUMENTS

| | | |
|---|---|---|
| 2011/0013429 A1 | 1/2011 | Campbell et al. |
| 2012/0141848 A1 | 6/2012 | Nagaoka et al. |

\* cited by examiner

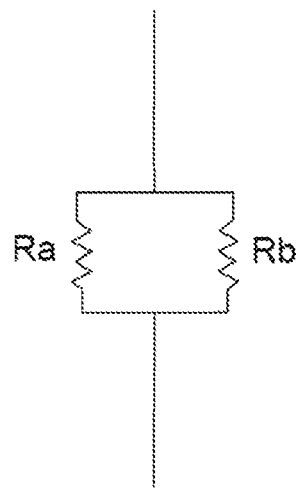
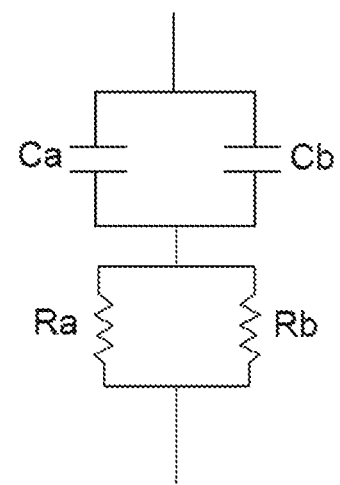
FIG.3a    FIG.3b
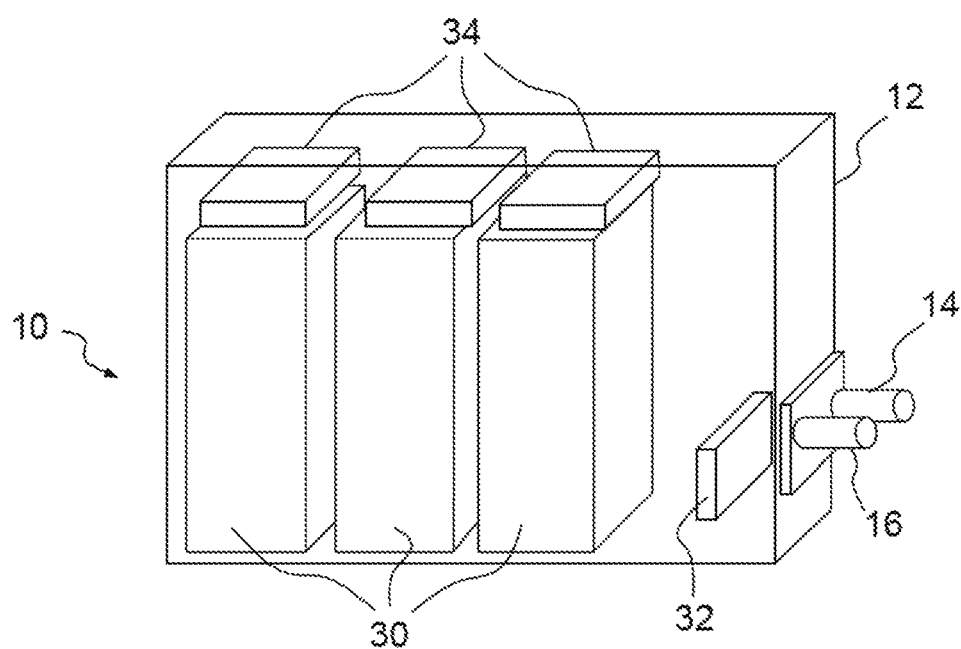
FIG.4

PROTECTION OF AN ELECTRICAL ENERGY ACCUMULATION DEVICE

CROSS-REFERENCE TO RELATED APPLICATIONS

This application is a National Stage of International patent application PCT/EP2017/072537, filed on Sep. 8, 2017, which claims priority to foreign French patent application No. FR 16/01330, filed on Sep. 9, 2016, and French patent application No. 1660667, filed Nov. 4, 2016, the disclosures of which are incorporated by reference in their entireties.

FIELD OF THE INVENTION

The invention relates to the protection of an electrical energy accumulation device from electromagnetic attacks.

BACKGROUND

To accumulate electrical energy and allow equipment to be supplied with power, numerous types of electrical energy accumulator are currently available, such as in particular lithium-ion, nickel-cadmium, etc. batteries. It is also possible to use electrochemical power capacitors as accumulators. Generally, the devices exchange electrical energy in the form of a DC voltage.

These accumulation devices are sensitive to electromagnetic interference, in particular to that passing over the electrical lines that are connected to the accumulation devices. The interference, which is often high-frequency interference, puts a strain on the accumulation devices, causing these devices to age prematurely.

Recently, with the increase in the use of accumulation devices, explosions, which sometimes remain unexplained, have been observed. In the absence of a determined cause for these explosions and to limit the consequences thereof, it is possible to employ metal containment for the elementary storage cells held in the accumulation devices. The metal containment does not prevent the destruction of the cells but allows the propagation of smoke and flames resulting from the explosion to be contained. It is also possible to increase the thicknesses of the metal containment and of the separators inside the accumulation devices and inside the devices, and in particular between the terminals of the devices. One likely cause of explosions, or at the very least of excessive heating, lies in the presence of electromagnetic interference in the equipment connected to the accumulation devices or even inside the accumulation devices themselves.

By itself, the accumulation device is generally not, or hardly, susceptible to electromagnetic interference. The equipment in which the accumulation device is installed may include parasitic elements, such as wiring inductances, which may resonate with the parasitic capacitances that are present between the housing and the elementary storage cells.

Placing capacitors between the terminals of the energy accumulation device and its housing might seem to be sufficient to remove high-frequency interference. However, the presence of such a component, coupled with wiring inductances, results in resonances which may be harmful. At best, the capacitors will modify the resonant frequency, but there is a risk of the resonance being amplified. At the resonant frequency, the currents induced by electromagnetic waves are greatly amplified and result in very high levels of heating, in particular on the peripheral layers of the elementary storage cells. This heating may result in the cells being destroyed.

SUMMARY OF THE INVENTION

The invention aims to overcome all or some of the problems mentioned above by providing a novel electrical energy accumulation device comprising means for protection from electromagnetic interference. These means make it possible to avoid, or at the very least to limit and to attenuate, the propagation of the interference into the interior of the accumulation device. These means form a barrier allowing the interference to be blocked at the terminals of the accumulation device so as to prevent it from reaching the elementary storage cells of the devices. More specifically, the invention proposes placing at least one resistor between one of the terminals of the energy accumulation device and its housing. This resistor allows the effect of the resonances due to the parasitic capacitances and inductances to be limited by allowing them to be damped.

To this end, the subject of the invention is an electrical energy accumulation device comprising a housing made of an electrically conductive material, at least one electrical energy storage cell that is arranged in the housing and two terminals that are arranged through the housing, the terminals being electrically insulated from the housing, the terminals allowing electrical energy to be transferred between the at least one storage cell and the exterior of the device, characterized in that the device further comprises a specific component exhibiting an impedance having at least one resistive component that is higher than 1 ohm, which component is configured to dissipate the energy of electromagnetic interference attempting to penetrate the housing through at least one of the terminals.

The impedance is advantageously arranged inside the housing and connects a first of the terminals to the housing, the first impedance forming a high-pass filter that is configured to channel away, toward the housing, electromagnetic interference attempting to propagate through the first terminal.

The impedance is referred to as the first impedance, and the device advantageously further comprises, inside the housing, a second impedance having at least one resistive component that is higher than 1 ohm and connecting a second of the terminals to the housing, the second impedance forming a high-pass filter that is configured to channel away, toward the housing, electromagnetic interference attempting to propagate through the second terminal.

Advantageously, the device further comprises, inside the housing, a third impedance having at least one resistive component that is higher than 1 ohm, forming a high-pass filter and connecting the two terminals to one another.

The device may comprise, inside the housing, a plurality of electrical energy storage cells that are connected to the terminals and impedances, each of which is associated with one of the electrical energy storage cells and has at least one resistive component that is higher than 1 ohm.

The one or more impedances may each comprise a capacitor and a resistor that are connected in series or in parallel and/or a plurality of resistors that are connected in parallel and/or a plurality of inductors L that are connected in series or in parallel.

Advantageously, the device comprises a means for comparing a voltage that is present at the common point of the capacitor and of the resistor of the first impedance and/or of the second impedance with a reference voltage, and a means for informing of a difference between the voltage that is present at the common point and the reference voltage.

According to one variant of the device, the impedance is referred to as the fourth impedance and forms a low-pass filter that is connected in series with a conductor connecting a first of the terminals and the at least one storage cell.

The device advantageously comprises a fifth impedance forming a low-pass filter that is connected in series with a conductor connecting a second of the terminals and the at least one storage cell.

The fourth and the fifth impedances may each be formed of a winding that is connected in series between the at least one cell and the respective terminal. The device may comprise a magnetic circuit that is common to the fourth and to the fifth impedances.

Advantageously, the device further comprises a means for testing the fourth impedance and, if applicable, the fifth impedance.

The fourth and, if applicable, the fifth impedance may each be formed of a primary winding and the test means may comprise a secondary winding that is coupled to the primary winding for each of the fourth and, if applicable, the fifth impedance.

The fourth impedance and, if applicable, the fifth impedance may be formed of a ferromagnetic material surrounding the conductor connecting the terminal in question and the at least one storage cell.

BRIEF DESCRIPTION OF THE DRAWINGS

The invention will be better understood and further advantages will become apparent upon reading the detailed description of one embodiment provided by way of example, which description is illustrated by the attached drawing, in which:

FIGS. 2a, 2b, 2c, 3a and 3b show several examples of impedances that may be used in the device of FIG. 1;

FIG. 4 is a perspective view of an exemplary arrangement of components of the device of FIG. 1;

For the sake of clarity, the same elements will bear the same references in the various figures.

DETAILED DESCRIPTION

Figure 1:
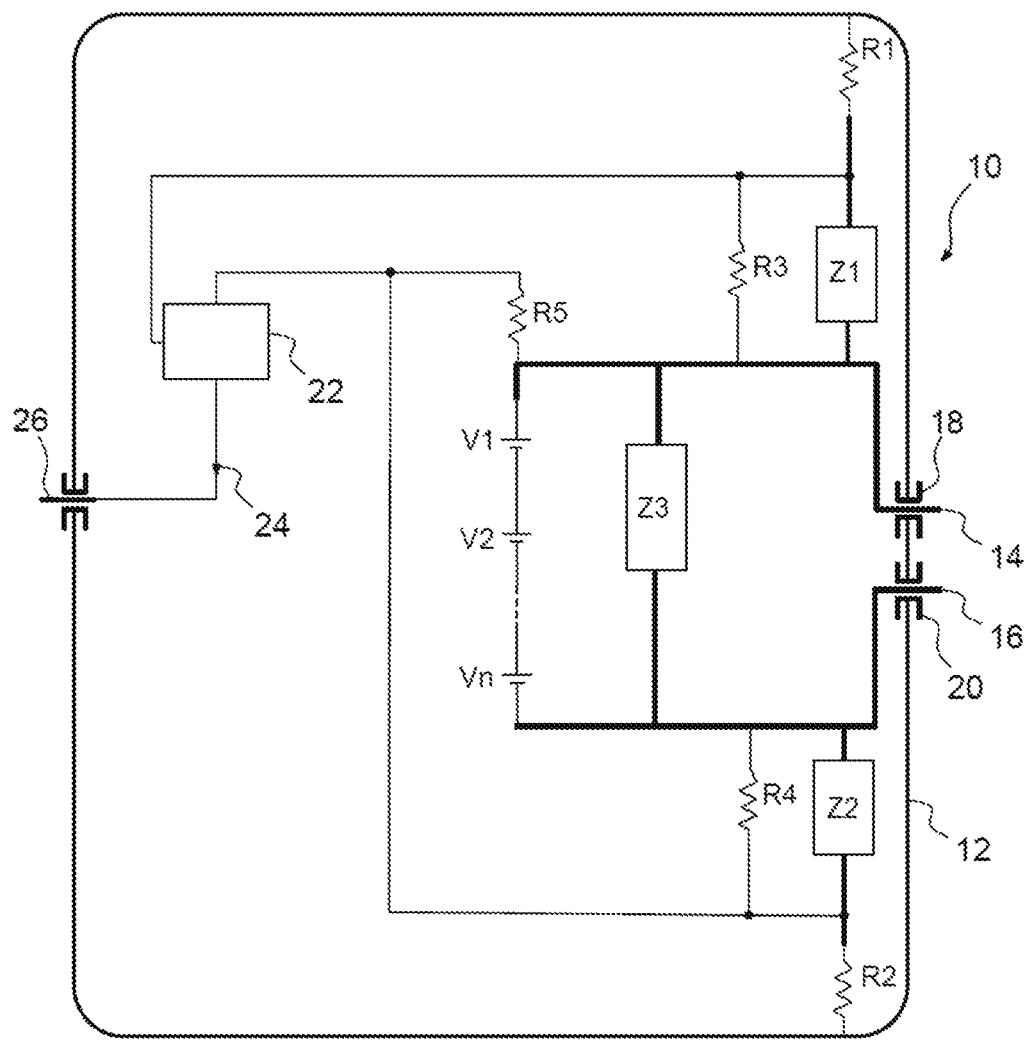
FIG. 1 schematically shows an electrical energy accumulation device according to the invention.

FIG. 1 schematically shows an electrical energy accumulation device 10. The device 10 may be incorporated within any on-board system, in particular on board an aircraft.

The device 10 comprises a housing 12 within which the components of the device 10 are located. The housing 12 is made of electrically conductive material. It is for example formed of a casing made of metal or of any other conductive material. The housing may for example be made of carbon fibers embedded in a resin. The device 10 comprises one or more electrical energy storage elements that are arranged in the housing 12. Various types of storage element may be used in the context of the invention, such as for example accumulator batteries or electrochemical capacitors.

In FIG. 1, a plurality of batteries V1, V2 . . . Vn, each forming a storage element, is connected in series in order to increase the operating voltage of the device 10. When a plurality of storage elements is used, it is possible to connect said storage elements differently, in particular in parallel. It is of course possible to connect a plurality of storage elements both in series and in parallel. The device comprises two terminals 14 and 16 allowing the device 10 to be connected to an external network. The terminals 14 and 16 are arranged through the housing 12. The terminals 14 and 16 are electrically insulated from the housing 12. An insulator 18 surrounds the terminal 14 and an insulator 20 surrounds the terminal 16. The insulators 18 and 20 may mechanically secure their respective terminal 14 and 16 to the housing 12. Generally, energy storage devices operate with direct current. The terminal 14 forms the positive terminal and the terminal 16 forms the negative terminal of the device 10. In the context of the invention, it is possible to use an energy storage device operating with alternating current.

According to the invention, the device 10 comprises, inside the housing 12, at least one impedance connecting one of the two terminals 14 and 16 to the housing 12. The impedance exhibits at least one resistive component that is higher than 1 ohm so as to allow resonances due to the coupling of inductances and capacitances that are present in the device itself and in its environment to be damped. The inductances and the capacitances may be specific components or parasitic elements that are due in particular to the wiring. The impedance may be produced in the form of a resistor connecting one of the terminals 14 and 16 directly to the housing 12. When the potential of the housing 12 is equal or close to that of one of the terminals, for example the negative terminal 16, the resistor allows the resonances to be damped without discharging a device operating with direct current. For this, it is important to keep the terminal 16 insulated from the housing 12 where the terminal 16 passes through the housing 12 in order to avoid shorting the resistor. However, a resistor on its own placed directly between the positive terminal 14 and the housing 12 would tend to discharge the device. This may be acceptable for accumulation devices operating with short cycles, such as for example with supercapacitors. To avoid this discharging, it is advantageous to connect a capacitor in series with the resistor. The impedance then forms a high-pass filter that is configured to channel away, towards the housing, electromagnetic interference attempting to propagate through the terminal that is connected to the housing via the impedance. A cut-off frequency of the high-pass filter is defined according to the type of interference that is desired to be filtered out. For a device 10 operating with direct current, the cut-off frequency may be very low, of the order of kHz. For a device operating with alternating current, the cut-off frequency must be higher than the frequency of the alternating current. If only one of the terminals 14 and 16 is connected to the housing, the one that is chosen is that for which the circuit external to the device to which the terminal is connected is the most likely to convey interference. This is generally high-frequency interference that the circuit may convey. This interference may come from components of the external circuit or result from electromagnetic radiation received by the conductors of the external circuit. In the case of a device 10 operating with direct current, the negative terminal may be connected to a ground of the external circuit. This ground may be formed by a large number of mechanical parts for which it is necessary to set the potential, for example by providing them with good surface metallization. These mechanical parts may form an antenna picking up electromagnetic radiation of any kind. It is therefore advantageous to connect the negative terminal 16 to the housing 12 via an impedance forming a high-pass filter.

In practice, the storage device 10 may be connected to various external circuits and when designing the device it is advantageous to protect the two terminals 14 and 16 from electromagnetic interference in order to standardize the manufacture of devices 10. To this end, the two terminals 14 and 16 are each connected to the housing 12 through an impedance, each impedance comprising a resistive component and each advantageously forming a high-pass filter. In FIG. 1, an impedance Z1 connects the terminal 14 to the housing 10 and an impedance Z2 connects the terminal 16 to the housing 10.

In the event of a fault in one of the impedances Z1 and Z2, in particular in the event that the connection between the housing 12 and the respective terminal is broken, protection from interference is no longer ensured. Advantageously, to overcome this problem, the device 10 comprises a third impedance Z3 connecting the two terminals 14 and 16. The third impedance Z3 also comprises a resistive component and advantageously forms a high-pass filter. Thus, in the event that the impedance Z1 fails, interference present on the terminal 14 may still be channeled away toward the housing 12 through the impedances Z3 and Z2 that are connected in series. Similarly, in the event that the impedance Z2 fails, the interference present on the terminal 16 is conveyed toward the housing 12 through the impedances Z3 and Z1 that are connected in series. The device is thus tolerant of a fault in one of the impedances Z1 and Z2. A fault in the impedance Z3 is also acceptable, the interference then being channeled away by one of the impedances Z1 and Z2. A fault may be caused by a component of one of the impedances Z1, Z2 and Z3 failing. This failure may be due to the component itself or due to the component being overloaded during its use.

Figures 2A, 2B, 2C:
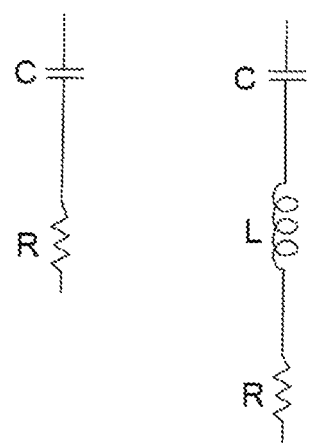

FIGS. 2a, 2b and 2c show three examples of impedances that may be used in the device of FIG. 1. FIG. 2a shows a resistor R on its own, FIG. 2b shows a capacitor C in series with a resistor R and FIG. 2c shows a capacitor C, an inductor L and a resistor R, all three in series.

A capacitor on its own exhibiting a substantial series resistance may be sufficient to produce an impedance such as Z1, Z2 or Z3. To produce a high-pass filter, the series resistance of the capacitor forms the equivalent of a resistor and a capacitor connected in series such as shown in FIG. 2b. More specifically, in the case of the impedances Z1 and Z2, the series resistance may be distributed between both the conductor connecting the terminal in question and the capacitor and the conductor connecting the capacitor to the housing 12. In the case of the impedance Z3, the resistance may be distributed between the two conductors connecting the capacitor C to each of the terminals 14 and 16.

To increase the value of the resistance R associated with the capacitor C, it is possible to connect a specific resistive component in series with the capacitor C such as shown in FIG. 2b.

Similarly, conductors generally exhibit an inductance intrinsically, which may be of the order of one nH per mm length of the conductor. It is possible to increase the value of this inductance by connecting an inductive component L in series with the capacitor C and the resistor R, as shown in FIG. 2c. It is of course possible to connect only a capacitor C and an inductive component L in series, the resistance being provided by the series resistances of each component L and C.

FIGS. 3a and 3b show variants of impedances in which a plurality of resistors Ra and Rb and, optionally, a plurality of capacitors Ca and Cb are connected in parallel. All of the resistors present in FIG. 1 may be combined in series and in parallel. Similarly to FIG. 3b, it is also possible to add a plurality of inductive components L that are connected in series or in parallel. These connections in parallel allow redundancy in components and provide part of the safety. Thus, when one of them fails, the one or more others allow the impedance to perform its function. The characteristics of the impedance are altered but the function is still performed. In FIG. 3b, a common point of the capacitors Ca and Cb is connected to a common point of the resistors Ra and Rb. Alternatively, it is possible to connect a plurality of disjunct assemblies, each formed by a resistor R and a capacitor C, in parallel. An inductive component L may also be connected in series or in parallel in each disjunct assembly.

In the example shown, two components of each type are connected in parallel. It is of course possible to envisage a greater number of components connected in parallel.

Tests carried out internally have shown that the minimum value of the resistive component of the impedance Z1, and of the impedances Z2 and Z3 if present, is of the order of 1Ω to ensure that the LC resonances are damped sufficiently. In general, the damping resistance R may be defined by:

$$R = K\sqrt{\frac{L}{C}}$$

K is a coefficient that is dependent on the environment. K may be defined by solving differential equations for the electromagnetic behavior of the components that are present. K may also be defined by simulation, for example by using software for simulating analog electronic circuits such as for example SPICE (Simulation Program with Integrated Circuit Emphasis) developed by the University of California, Berkeley in the United States. L represents the parasitic equivalent inductance of the energy accumulation device and of its environment. C represents the parasitic equivalent capacitance of the energy accumulation device and of its environment. The value of the resistance is chosen according to the environment of the accumulation device when in use. For example, in an environment defined internally for a 28 V, 56 A.h lithium-ion battery used in an aircraft, a value of the order of 10Ω may be adopted. In combination with this resistance, a capacitance of 100 nF may also be adopted. More generally, a good level of protection of an accumulation device is obtained, with resistor values of of between 1 and 1000Ω, and capacitance values of a capacitor connected in series with the resistor of between 10 nF and 1 µF.

It should be noted that in order to obtain resistance values of higher than 1Ω, the typical resistance of wiring is far from being sufficient. By connecting a capacitor on its own between one of the terminals 14 and 16 and the housing 12, the connecting wires might at best generate a resistance of the order of a few milliohms. The resistance of the wiring is much too low to produce the necessary damping. Such a resistance would not be capable of dissipating, through Joule heating, the energy from electromagnetic interference attempting to penetrate the housing 12. For example, a copper wire with a diameter of 0.254 mm has a resistance per unit length of 338 mΩ/m. Even using 10 cm of wire, 34 mΩ is obtained, which is much too low to damp interference in an aeronautical environment.

The presence of a specific resistive component or resistor R may advantageously be used to test the impedances. For a given impedance, this test is advantageously carried out by comparing the voltage measured in the impedance at the common point of the resistor R and of the capacitor C with a reference voltage. In FIG. 1, a resistor R1 is shown in series with the impedance Z1 and a resistor R2 is shown in series with the impedance Z2. It goes without saying that the resistors R1 and R2 may form the resistive component of the impedance in question by themselves and participate in the high-pass filtering function of the impedances Z1 and Z2. The measurement for the test is taken at the common point of the impedance Z1 or Z2 and of its associated resistor connected in series R1 or R2. If the impedance already comprises a resistor, it is of course possible to take the measurement at one of the terminals of this resistor. A fault in the capacitor C or in the resistor R modifies the measured voltage. It is possible to improve the measurement by connecting a resistor in parallel with the capacitor. For example, in FIG. 1, a resistor R3 is connected in parallel with the impedance Z1 and a resistor R4 is connected in parallel with the impedance Z2. The resistors R1 and R3 form a voltage divider at the central point from which the measurement is taken. The same applies for the resistors R4 and R2.

It is possible to provide a comparison means that is specific to each impedance Z1, Z2 and Z3. To simplify the device, it is advantageous to provide one comparison means that is common to a plurality of impedances. For example, in FIG. 1, a comparison means 22 compares a voltage of the impedance Z1 and a voltage of the impedance Z2. A resistor R5 is arranged between the positive terminal 14 and the comparison point of the impedance Z2 in order to bring the voltage measured in the impedance Z2 to a value close to that measured in the impedance Z1.

In combination with the comparison means 22, the device 10 further comprises a means 24 for informing of a difference between a result of the comparison and an expected result. This informing means 24 may be of any type, e.g. an acoustic or visual signal or simply an electrical signal that is available over a terminal 26 leading out of the housing 12. The electrical signal may be used by a controller that is external or internal to the device. In the event of a signal indicating a fault in the electromagnetic protection means, in particular a failure of one of the impedances Z1, Z2 and Z3, the controller may disconnect the device 10 from the network in which it is being used. However, the device 10 is still kept safe by the redundancy in the components and in the high-pass filters.

FIG. 4 is a perspective view of an exemplary arrangement of components of the device 10 which comprises a plurality of elementary energy storage cells 30 arranged in the housing 12. In FIG. 4, three cells 30 are shown. The invention may be used regardless of the number of cells 30. The connection of the cells 30 to the terminals 14 and 16 is not shown, along with any circuit boards of the device. It is possible to connect the various cells 30 in series, in parallel or by combining a series and parallel connection.

A first electromagnetic protection block 32 is shown in the vicinity of the terminals 14 and 16. The block 32 comprises the one or more impedances Z1, Z2, and Z3, and optionally the resistors R1, R2, R3, R4 and R5 and the comparison 22 and informing 24 means. This block 32 is arranged as close as possible to the terminals 14 and 16 so as to limit the advance of electromagnetic interference into the housing 12.

To further improve the protection of the device 10 from electromagnetic interference, in combination with each cell 30, the device may comprise at least one impedance such as described above. In FIG. 4, in combination with each cell 30, an electromagnetic protection block 34 is shown. Each block 34 comprises, like the block 32, the one or more impedances Z1, Z2, and Z3, and optionally the resistors R1, R2, R3, R4 and R5 and the comparison 22 and informing 24 means. Each block 34 is arranged as close as possible to the cell 30 with which it is associated.

Figure 5:
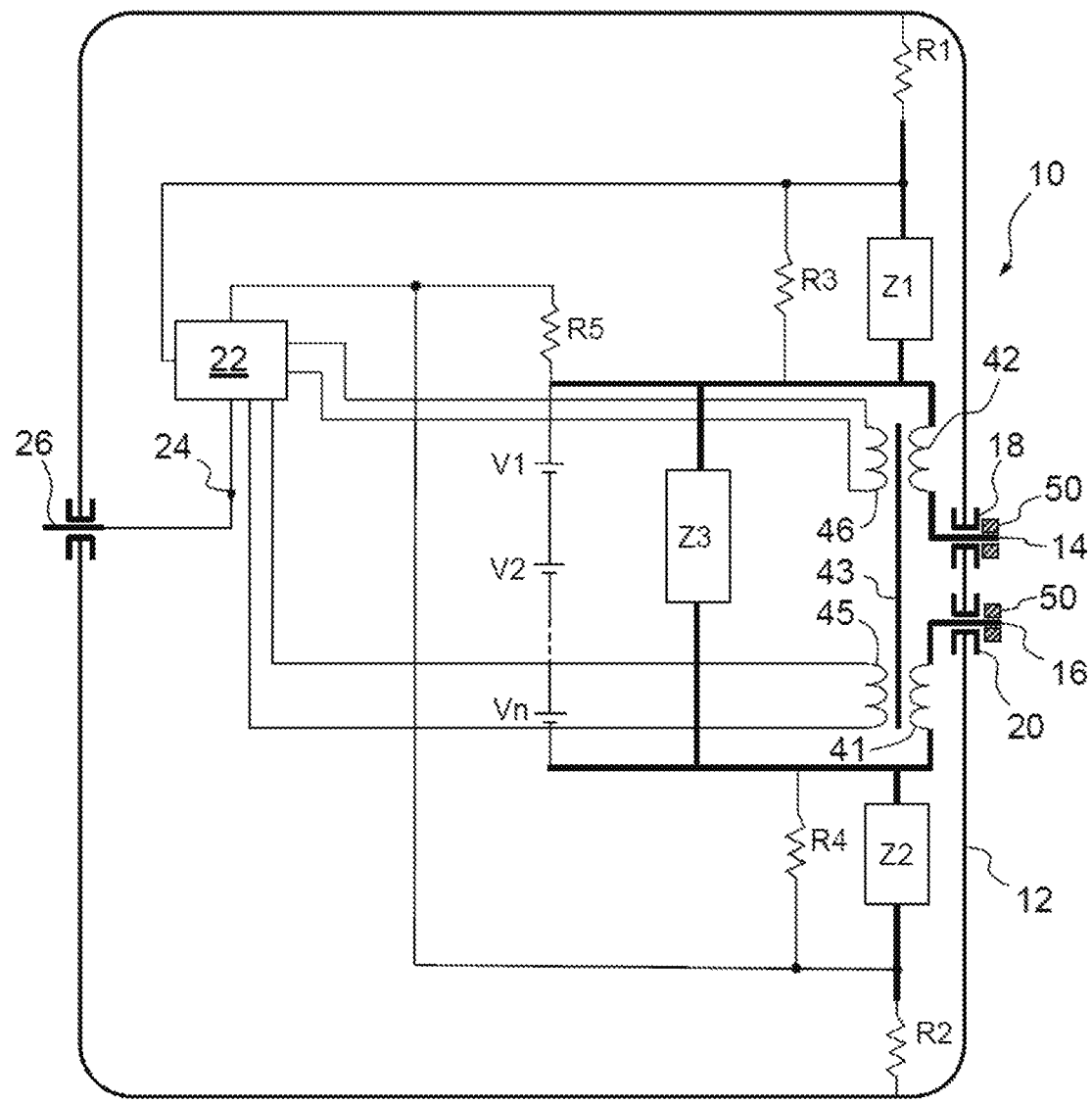
FIG. 5 shows one variant of an electrical energy accumulation device according to the invention.

FIG. 5 shows one variant of an electrical energy accumulation device 40. All of the elements already described with the aid of FIG. 1 are found there. The device 40 further comprises at least one impedance forming a low-pass filter that is connected in series with a conductor connecting one of the terminals 14 and 16 and the one or more storage cells. Each impedance allows the energy from high-frequency electromagnetic interference to be dissipated while allowing only the useful low-frequency signals, i.e. the energy stored in the cells, to pass from or to the storage cells. The cut-off frequency of the filter is chosen according to the frequency of the nominal current used for energy storage in the device.

Each low-pass filter is for example formed of an inductor, such as for example a winding, that is connected in series with the respective terminal 14 or 16. Alternatively, it is possible to form the low-pass filter by means of a winding or of a ferromagnetic material 50 that is arranged around the conductor connecting the one or more terminals in question. In particular, it is possible to use a ferrite or materials made of an alloy of iron and of nickel and/or of silicon, and/or of cobalt, etc. These materials exhibit for example an amorphous or crystalline structure. These different embodiments, i.e. winding or ferromagnetic material, are suitable for the inductor shown in FIG. 2c.

Ferromagnetic materials exhibit a magnetic permeability that is modeled in a complex manner often represented in the following way:

$$\mu = \mu_s' - j\mu_s''$$

The real part of the magnetic permeability represents the purely inductive component provided by the material. The imaginary part represents the losses and may be likened to a series resistance, which may advantageously be used to provide the desired damping. This resistance is combined with that connected to the housing 12. In determining the resistive component of the impedance that is configured to dissipate the energy of the electromagnetic interference, the imaginary part of the magnetic permeability is taken into account.

The one or more impedances forming a low-pass filter may be located inside the housing 12 in series between the terminal in question and the storage cell. It is also possible to arrange these one or more impedances outside the housing 12 and, advantageously, as close as possible thereto, i.e. in contact with the housing 12 so as to limit the length of the electrical conductors that are located between the one or more impedances and the one or more storage cells, in particular over the portion of these conductors located outside the housing 12. The possibility of arranging the one or more impedances outside the housing 12 also applies to the high-pass impedances described with the aid of FIG. 1.

Like for the high-pass impedances, it is possible to arrange only one low-pass impedance connected in series with the chosen terminal 14 or 16. However, advantageously, a low-pass impedance is arranged in combination with each of the terminals 14 and 16.

In the example shown in FIG. 5, a winding 41 is arranged inside the housing 12 in series between the negative terminal 16 and the negative terminal of the battery Vn. A winding 42 is arranged inside the housing 12 in series between the positive terminal 18 and the positive terminal of the battery V1. The two windings 41 and 42 may be independent of one another. Advantageously, the device comprises a magnetic circuit 43 that is common to the two windings 41 and 42, thereby making it possible to better dissipate differential-mode interference between the two terminals 14 and 16.

Like for the high-pass impedances, the device 40 may comprise a means for testing the impedances 41 and 42. This test means comprises for example a secondary winding 45 that is coupled with the winding 41, referred to as a primary winding, and a secondary winding 46 that is coupled with the winding 42, also referred to as a primary winding. For each impedance 41 and 42, a secondary winding is coupled with a primary winding, allowing the current that flows therethrough to be measured and to be compared with an expected value, by using for example the comparator 22. For this, the secondary windings are connected to the comparator 22.

High-pass filters have been described with the aid of FIG. 1 and low-pass filters have been described with the aid of FIG. 5. It is of course possible to arrange either one of the two types of filter or both types of filter in the device. It is also possible to use plug filters (parallel bandpass or series bandstop filters) that are suitable for a type of interference that has been identified in the band of the filter.

The invention claimed is:

1. An electrical energy accumulation device comprising a housing made of an electrically conductive material, at least one electrical energy storage cell that is arranged in the housing and two terminals that are arranged through the housing, the terminals being electrically insulated from the housing, the terminals allowing electrical energy to be transferred between the at least one storage cell and the exterior of the device wherein the device further comprises a specific component exhibiting an impedance having at least one resistive component that is higher than 1 ohm, which component is configured to dissipate the energy of electromagnetic interference attempting to penetrate the housingthrough at least one of the terminals.

2. The device as claimed in claim 1, wherein the impedance is arranged inside the housing and connects a first of the terminals to the housing, the impedance forming a high-pass filter that is configured to channel away, toward the housing, electromagnetic interference attempting to propagate through the first terminal.

3. The device as claimed in claim 2, wherein characterized in that the impedance is referred to as the first impedance, and in that the device comprises, inside the housing, a second impedance having at least one resistive component that is higher than 1 ohm and connecting a second of the terminals to the housing, the second impedance forming a high-pass filter that is configured to channel away, toward the housing, electromagnetic interference attempting to propagate through the second terminal.

4. The device as claimed in claim 3, wherein it comprises, inside the housing, a plurality of electrical energy storage cells that are connected to the terminals and impedances, each of which is associated with one of the electrical energy storage cells and has at least one resistive component that is higher than 1 ohm.

5. The device as claimed in claim 3, wherein it comprises a means for comparing a voltage that is present at the common point of the capacitor and of the resistor of the first impedance and a voltage that is present at the common point of the capacitor and of the resistor of the second impedance, and a means for informing of a difference between a measured result of the comparison and an expected result.

6. The device as claimed in claim 2, wherein it comprises, inside the housing, a third impedance having at least one resistive component that is higher than 1 ohm, forming a high-pass filter and connecting the two terminals to one another.

7. The device as claimed in claim 2, wherein the one or more impedances each comprise a capacitor and a resistor that are connected in series.

8. The device as claimed in claim 7, wherein it comprises a means for comparing a voltage that is present at the common point of the capacitor and of the resistor with a reference voltage and a means for informing of a difference between the voltage that is present at the common point and the reference voltage.

9. The device as claimed in claim 2, wherein the one or more impedances each comprise a plurality of capacitors that are connected in parallel.

10. The device as claimed in claim 2, wherein the one or more impedances each comprise a plurality of resistors that are connected in parallel.

11. The device as claimed in claim 2, wherein the one or more impedances each comprise a plurality of inductors L that are connected in series or in parallel.

12. The device as claimed in claim 1, wherein the impedance is referred to as the fourth impedance and forms a low-pass filter that is connected in series with a conductor connecting a first of the terminals and the at least one storage cell.

13. The device as claimed in claim 12, wherein the device comprises a fifth impedance forming a low-pass filter that is connected in series with a conductor connecting a second of the terminals and the at least one storage cell.

14. The device as claimed in claim 13, wherein the fourth and fifth impedances are each formed of a winding that is connected in series between the at least one cell and the respective terminal, and in that the device comprises a magnetic circuit that is common to the fourth and fifth impedances.

15. The device as claimed in claim 12, wherein Hit comprises a means for testing the fourth impedance and, if applicable, the fifth impedance.

16. The device as claimed in claim 15, wherein the fourth impedance and, if applicable, the fifth impedance are each formed of a primary winding and in that the test means comprises a secondary winding that is coupled to the primary winding for each of the fourth impedance and, if applicable, the fifth impedance.

17. The device as claimed in claim 12, wherein the fourth impedance and, if applicable, the fifth impedance are formed of a ferromagnetic material surrounding the conductor connecting the terminal in question and the at least one storage cell.

\* \* \* \* \*

UNITED STATES PATENT AND TRADEMARK OFFICE
CERTIFICATE OF CORRECTION

PATENT NO. : 11,011,793 B2
APPLICATION NO. : 16/331102
DATED : May 18, 2021
INVENTOR(S) : Eric Ravindranath Dubois et al.

Page 1 of 1

It is certified that error appears in the above-identified patent and that said Letters Patent is hereby corrected as shown below:

In the Claims

In Claim 1, Column 9, Line 32, "penetrate the housingthrough at least one of the terminals." should be -- penetrate the housing through at least one of the terminals. --.

In Claim 3, Column 9, Line 40, "wherein characterized in that the impedance" should be -- wherein the impedance --.

Signed and Sealed this
Fifth Day of October, 2021

Drew Hirshfeld
*Performing the Functions and Duties of the*
*Under Secretary of Commerce for Intellectual Property and*
*Director of the United States Patent and Trademark Office*